TUNABLE PARAMETRIC AMPLIFIER WITH SIGNAL FREQUENCY HIGHER OR LOWER THAN PUMP FREQUENCY

Original Filed Jan. 16, 1962 3 Sheets-Sheet 1

INVENTOR
BENJAMIN J. LEON,
BY
Walter J. Adam
ATTORNEY.

INVENTOR.
BENJAMIN J. LEON,
BY
Walter J. Adam
ATTORNEY.

INVENTOR.
BENJAMIN J. LEON,
BY
Walter J. Adam
ATTORNEY.

United States Patent Office 3,244,992

Patented Apr. 5, 1966

3,244,992

TUNABLE PARAMETRIC AMPLIFIER WITH SIGNAL FREQUENCY HIGHER OR LOWER THAN PUMP FREQUENCY

Benjamin J. Leon, West Lafayette, Ind., assignor to Hughes Aircraft Company, Culver City, Calif., a corporation of Delaware Continuation of application Ser. No. 166,503, Jan. 16, 1962. This application May 28, 1964, Ser. No. 373,900
8 Claims. (Cl. 330—4.9)

This invention relates to parametric amplifiers and particularly to a tunable single stage linear parametric amplifier.

This application is a continuation of a copending application of Benjamin J. Leon, Serial Number 166,503, filed January 16, 1962, and now abandoned, entitled, Tunable Parametric Amplifier.

Parametric amplifiers which include a non-linear reactive element, an idler circuit and a source of pumping energy provide low noise amplification. Conventional parametric amplifiers operate at a selected frequency in response to two tuned circuits, one being tuned at a signal frequency and the other being tuned at an idler frequency to develop amplification at a frequency that is the difference of the pumping frequency and the idler frequency. Thus, these conventional amplifiers are only tunable by varying both the pumping frequency and other circuit parameters. Another disadvantage of conventional parametric amplifiers is the large number of circuit elements required for providing sharp skirts for the tuned circuits.

It is therefore an object of this invention to provide a tunable negative resistance parametric amplifier that is tuned by varying the pump frequency with all circuit elements within the amplifier having fixed values.

It is another object of this invention to provide a parametric amplifier circuit which may be tuned to amplify a source of signals over a very wide frequency range by varying only the pumping frequency.

It is a further object of this invention to provide a parametric amplifier circuit that provides amplification of the input at frequencies equal to both the sum and the difference of the pump and idler signal frequencies.

It is a still further object of this invention to provide a simplified parametric amplifier circuit that is resonant at only the idler frequency.

Briefly, in accordance with this invention, a simplified negative resistance parametric amplifier is provided that is tunable over a very wide frequency range by varying only the pumping frequency. A source of input signals and a source of pumping energy apply voltages to a non-linear capacitance element which in turn is coupled to a resonant idler tank circuit tuned to the idler frequency. The fixed parameters which form the idler tank circuit and other tuned isolating elements of the circuit are such that the admittance has a sharp resonance at the idler frequency and that the pumping frequency is larger than the idler frequency. The circuit provides amplification at a frequency equal to the difference between the pump and the idler frequencies. In another arrangement in accordance with this invention, which provides the idler tank circuit with a very sharp resonant frequency, amplification can also be obtained at a frequency equal to the sum of the pump and the idler frequencies.

The novel features of this invention, as well as the invention and its method of operation, will best be understood from the following detailed description taken in connection with the accompanying drawings, in which.

Figure 4:
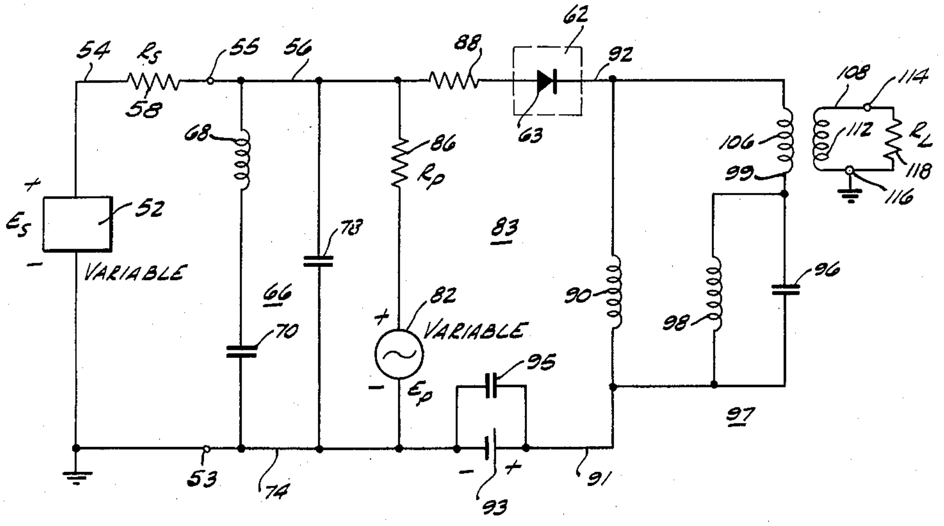
FIG. 4 is a schematic circuit diagram of another arrangement of a tunable parametric amplifier circuit in accordance with this invention which provides amplification at both the sum and the difference of the pump and idler frequencies.
Figure 8:
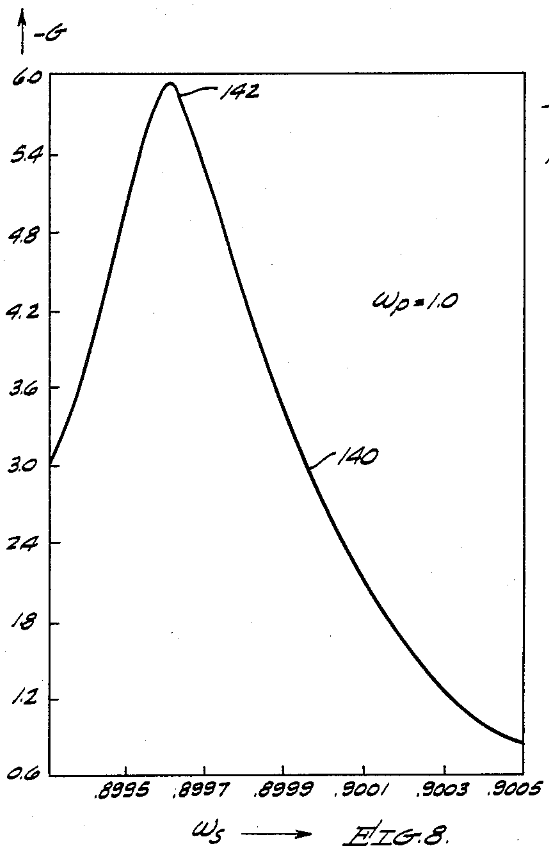
FIG. 8 is a graph of negative conductance versus signal frequency showing part of the negative conductance developed by the circuit of FIG. 4 at a selected pump frequency.
Figure 9:
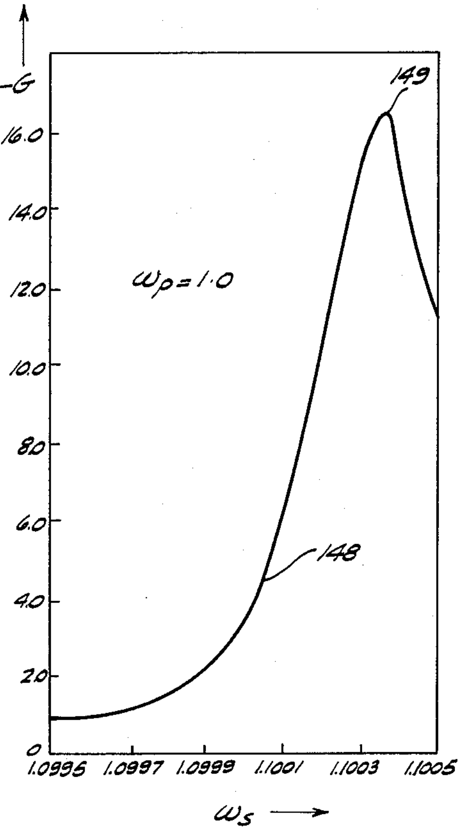
Figure 10:
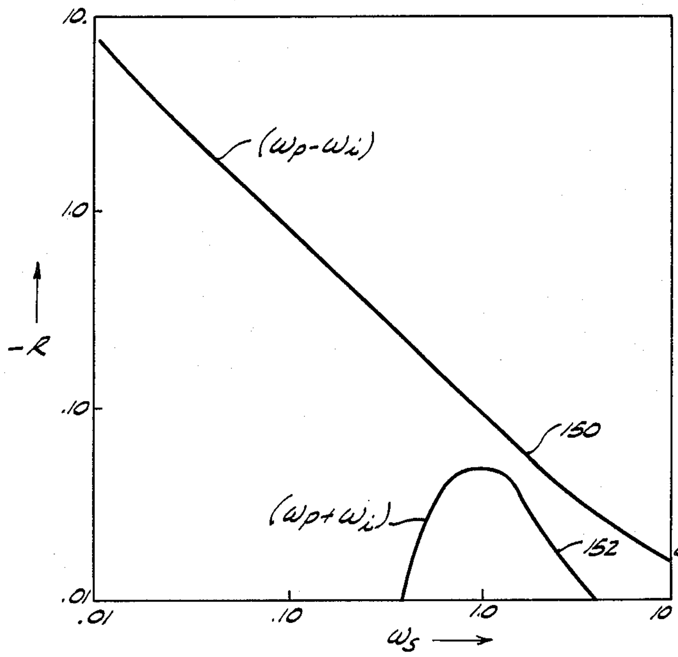

FIG. 9 is a graph of negative conductance versus signal frequency showing another part of the negative conductance developed by the circuit of FIG. 4 at the same selected pump frequency as that of the graph of FIG. 8; and FIG. 10 is a graph of the logarithm of negative resistance versus the logarithm of signal frequency showing the points of maximum negative resistance developed in the circuit of FIG. 4 over a wide range of signal frequencies.

Figure 1:
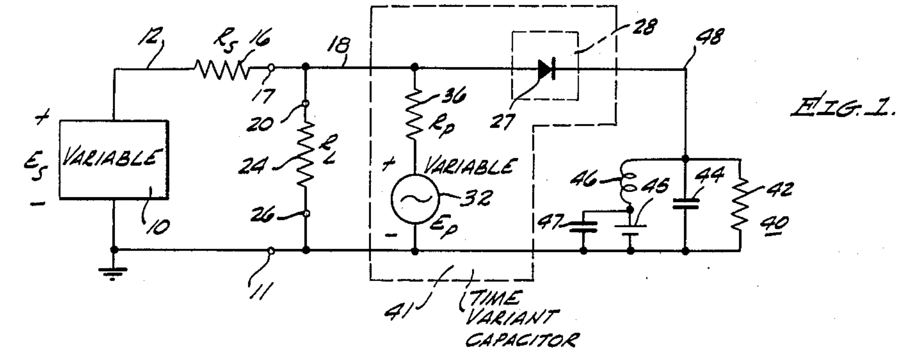
FIG. 1 is a schematic circuit diagram of one arrangement of a tunable parametric amplifier circuit in accordance with this invention.

Referring first to the parametric amplifier circuit of FIG. 1, an input signal source 10 may have one end coupled to a level of reference potential such as ground and to an input terminal 11 and the other end coupled to a lead 12 for applying an input signal $E_S$ through a source resistor 16 having a value $R_S$ to an input terminal 17. The source 10 may be a signal generator or any source of signals to be amplified and may provide the input signal $E_S$ at different frequencies. The input terminal 17 is coupled to a lead 18 and also to a terminal 20, with a load resistor 24 having a value $R_L$ being coupled between the terminal 20 and a terminal 26 which in turn is coupled to ground. The lead 18 is also coupled to a non-linear (voltage variable) capacitance element 28 which may be a conventional voltage variable non-linear capacitance diode 27 such as a varactor. The element 28, as shown by the equivalent circuit of the diode 27 in FIG. 2 at the frequency of the input signal $E_S$, will include a negative conductance 29 having a value $-G$ which is the negative conductance presented by the variable capacitive element at the frequency of the input signal $E_S$. Also, the element 28 includes a fixed capacitance 30 having a value of $C_0$ coupled in parallel with the negative conductance 29. To further explain the characteristics of the element 28, the equivalent circuit of the pumped diode of FIG. 3 shows a voltage variable capacitor 31 having a value $C_1 \cos \omega_P t$ where $\omega_P$ is the radian frequency of a pumping signal.

Figure 3:
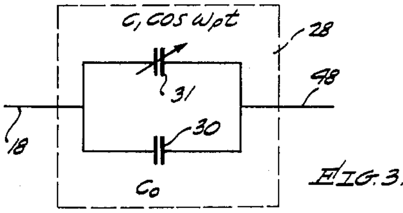
FIG. 3 is a schematic circuit diagram of the equivalent circuit of the pumped diode of FIG. 1.

A source 32 of selectively variable pumping signals $E_P$ at the radian frequency $\omega_P$ is provided, with one end coupled to ground, to apply the pumping signals through a pump resistor 36 having a value $R_P$ to the lead 18 and to the non-linear capacitance element 28 to develop an effective sinusoidal capacitance variation $C_1 \cos \omega_P t$ as seen in FIG. 3. The source 32 may be any conventional source of variable frequency signals such as a variable frequency oscillator as is well known in the art. The pumping source 32 and the capacitance element 28 together form a time variant capacitor 41 having the characteristics of FIG. 3. The time variant capacitor 41 may within the principles of this invention also be a motor driven butterfly condenser, for example, coupled in the circuit at the same location as the non-linear element 28. An idler circuit 40 which is a parallel resonant tank circuit tuned at the idler frequency includes a resistor 42, a capacitor 44 and an inductor 46 coupled in parallel between ground and a lead 48 which in turn is coupled to the capacitance element 28. To provide biasing to the diode 27, a battery 45 and by-pass capacitor 47 are coupled in parallel between one end of the inductor 46 and the ground terminal 11. The idler circuit 40 is tuned to be resonant at an idler radian frequency $\omega_i$ equal to $(\omega_P-\omega_S)$ where $\omega_P$ is the radian frequency of the signal $E_P$ supplied by the pump source 32 and $\omega_S$ is the radian frequency of the signal $E_S$ applied to the circuit from the input source 10. Thus, the frequency of the pumping source 32 is varied to provide tuning when the frequency of the source 10 of input signals varies, as the idler circuit 40 is maintained tuned at the frequency $(\omega_P-\omega_S)$. As will be discussed subsequently, the circuit of FIG. 1 provides amplification at the input signal frequency across the load resistor 24. The circuit provides resonance which is the equivalent of parallel resonance at the idler frequency $\omega_i$ through the capacitance element 28, by a current path including the element 28, the inductor 46 and the load resistor 24. It is to be noted that in the circuit of FIG. 1, only the one resonant circuit 40 tuned to the idler frequency is required for amplification.

Figure 2:
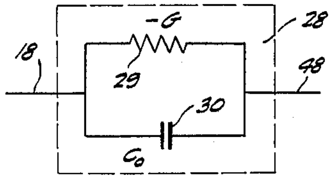
FIG. 2 is a schematic circuit diagram of an equivalent circuit of the non-linear capacitance element of FIG. 1 as it appears to the input signal frequency voltage.

The parametric amplifier circuit of FIG. 4 includes a source 52 of input signals $E_S$ having one end coupled to ground and to an input terminal 53 and having the other end coupled to a lead 54 which in turn is coupled through a source resistor 58 providing a resistance of $R_S$ to an input terminal 55. A lead 56 is coupled from the terminal 55 via a resistor 88 to one end of a non-linear capacitance element 62 which may include a voltage variable non-linear capacitive diode 63 such as a varactor. When pumped from a source of pump signals 82, the non-linear capacitance element 62 appears as a time variant capacitance that develops the sinusoidal capacitance variation $C_1 \cos \omega_P t$ as shown in FIG. 3. An equivalent negative conductance $-G$ and fixed capacitance $C_0$ similar to the respective parallel coupled negative conductance 29 and capacitor 30 of FIG. 2 is also presented to the input signal $E_S$ by the capacitance element 62. A first resonant circuit 66 tuned at the idler frequency for providing a short circuit to ground to isolate the idler circuit from the input signal source 52 includes an inductor 68 and a capacitor 70 coupled in series between the lead 56 and a ground lead 74. A tuning capacitor 78 is provided between the leads 56 and 74. The source 82 of pumping signals $E_P$ has one end coupled to the ground lead 74 and the other end coupled through a pumping source resistor 86 having a value $R_P$ to the lead 56. The resistor 86 provides isolation of the pumping source 82 from the element 62. The pumping source 82 is controllable to provide a variable frequency for tuning the frequency of amplification of the signal $E_S$. The input signal source 52 may be any source of signals to be amplified and which may change in frequency. Also, the pumping source 82 may be any signal generator of controllable frequency such as a signal generator utilizing voltage variable non-linear reactive elements. The pumping source 82 and the non-linear capacitance element 62 together form a time variant capacitor 83 having the characteristics of FIG. 3 as discussed relative to FIG. 1.

To provide series resonance with the capacitance of the capacitance element 62 at the idler frequency, an inductor 90 is coupled between a lead 91 and a lead 92 which in turn is coupled to the other end of the non-linear diode 63. A battery 93 and by-pass capacior 95 are coupled in parallel between the leads 74 and 91 to provide biasing to the diode 63. The idler currents which pass in series through the element 62 and the inductor 90 thus pass through the resonant circuit 66 or the capacitor 78. In order to keep the idler energy from the load circuit, a capacitor 96 and inductor 98 of a resonant circuit 97 are coupled in parallel between the lead 91 and a lead 99 which in turn is coupled through a winding 106 of a transformer 108 to the lead 92. The parallel resonant circuit 97 is tuned at the idler frequency to present a high impedance to signals at the idler frequency but is non-resonant or presents a low impedance to signals at the input signal frequency. The transformer 108 is provided with a second winding 112 coupled through terminals 114 and 116 to a load resistor 118 which may have a value $R_L$. The transformer 108, which may have a 1:1 ratio, allows the terminal 116 to be grounded.

Referring back to FIG. 1 for further explaining the operation of the parametric amplifier thereof, the circuit provides amplification at a signal frequency $\omega_S$ equal to $(\omega_P-\omega_i)$ with a minimum of circuit elements. The admittance $Y(\omega)$ seen by the variable part of the capacitance of FIG. 3 has been determined for the circuit of FIG. 1 having the following values, for example:

Resistor 16, $R_S=0.5$ ohm
Resistor 24, $R_L=0.5$ ohm
Resistor 36, $R_P$=relatively large
Capacitor 30, $C_0=4$ farads
Resistor 42=250 ohms
Capacitor 44=16 farads
Inductor 46=5 henries
Pump source adjusted so that $C_1$, the amplitude of the variable capacitance of the capacitor 31 is 2 farads.

The admittance $Y(\omega)$ is as follows for these values:

$$Y(\omega)=4j\omega+\frac{1}{0.25+\left[\dfrac{1}{16j\omega+.004+\dfrac{1}{5j\omega}}\right]} \quad (1)$$

where $\omega$ is the radian frequency such as the idler frequency, pumping frequency or input signal frequency and $j$ is the conventional designation for imaginary numbers. Equation 1 shows that resonance is present, i.e., $Y(\omega)$ is very small, when the idler frequency $\omega_i$ is approximately equal to 0.10 radian/second. A necessary condition for the circuit in accordance with this invention is that the admittance must be small at the idler frequency $\omega_i$ and need not be small at any other frequencies. The $4j\omega$ term of Equation 1 insures a broad response at other interesting frequencies. Another requirement of the circuit of FIG. 1 is that the idler frequency as determined by the resonant frequency of the circuit 40 be less than the pumping frequency.

Figure 5:
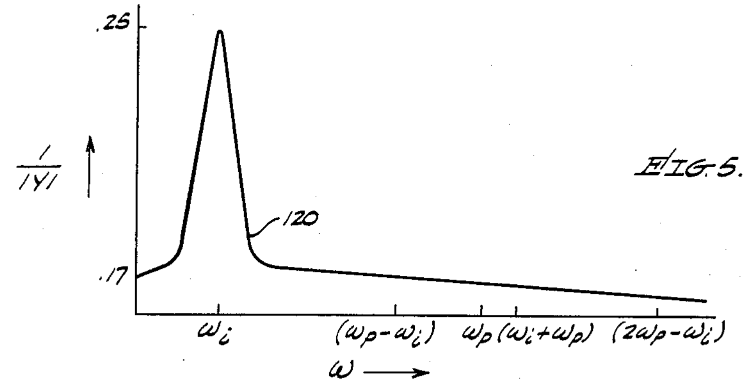
FIG. 5 is a graph of impedance versus frequency for showing the wide band operation of the circuits of FIGS. 1 and 4.

As shown by a curve 120 in FIG. 5 the impedance $$\frac{1}{|Y|}$$

seen by the variable capacitance part of the element 28, that is, the capacitance forming the negative conductance 29 of FIG. 2, has a sharp resonance peak at the idler frequency $\omega_i$ and is broadband at all other frequencies such as at the frequency $(\omega_P-\omega_i)$ which condition is provided by selection of the element values. The curve 120 of FIG. 5 was formed from information resulting from a simulated operation in a computer of the circuit of FIG. 1 with the above example of given element values. The curve 120 shows that a requirement of the circuit in accordance with this invention that only one resonant frequency is utilized, is satisfied to provide the negative resistance amplifier.

Figure 6:
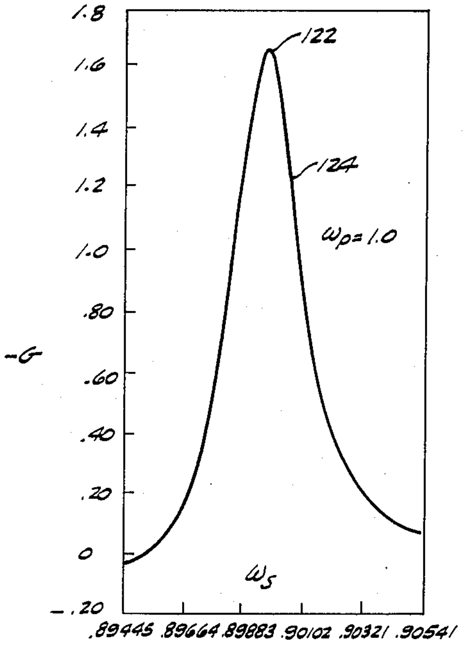
FIG. 6 is a graph of negative conductance versus input signal frequency showing the negative conductance developed by the circuit of FIG. 1 at a selected pump frequency.

The negative conductance $-G$ developed by the non-linear capacitance element 28 rises above zero to a maximum peak 122 at a signal frequency $\omega_S$ of approximately 0.899 radian/second for a pumping frequency $\omega_P$ of 0.1 radian per second as shown by a curve 124 of FIG. 6. Operation of the circuit of FIG. 1 was simulated on a computer with the values given above to provide the curve 124. Curves for other pumping frequencies were determined, and with an increasing pumping $\omega_P$, the maximum negative conductance peak 122 moves to the right for larger signal frequencies $\omega_S$. Thus, the circuit may be tuned to provide a negative conductance region and amplification at different signal frequencies because $\omega_S=(\omega_P-\omega_i)$ and $\omega_P$ may be varied.

Figure 7:
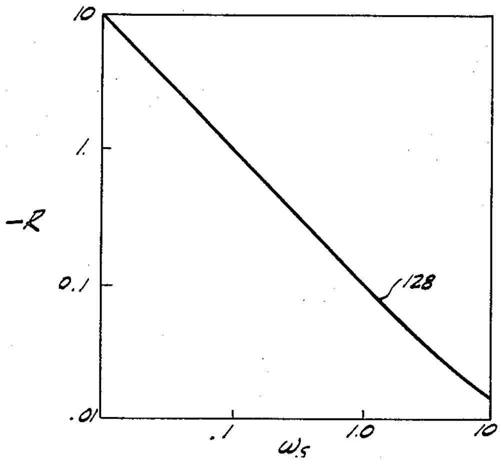
FIG. 7 is a graph of the logarithm of negative resistance versus the logarithm of signal frequency showing the points of maximum negative series resistance developed in the circuit of FIG. 1 by tuning over a wide range of signal frequencies.

The maximum negative conductance peaks such as 122 for various values of input signal frequency are plotted in FIG. 7 as a curve 128 by expressing the negative conductance as an equivalent negative resistance $-R$ in series with a capacitance. The curve 128 shows that a negative resistance and amplification is developed over an input signal frequency range of approximately 100:1. It is to be noted that the negative resistance and amplification decreases at higher signal frequencies but this may be taken into consideration in designing a system utilizing the parametric amplifier in accordance with the invention.

Referring now to FIG. 4 the operation of the parametric amplifier thereof in accordance with the invention will be explained in further detail. The circuit of FIG. 4 has elements selected so that the necessary condition in accordance with this invention that $\omega_i$ is less than $\omega_P$ is satisfied and the conventional condition that the capacitance element 62 has the property that the capacitance is always positive is satisfied. The admittance $Y(\omega)$ has been determined for the following element values:

Resistor 58, $R_S=0.2$ ohm
Resistor 86, $R_P$=a relatively large value
Resistor 88=0.004 ohm
Resistor 118 $R_L=0.31$ ohm
Inductor 68=1 henry
Inductor 90=25 henries
Inductor 98=6.3 henries
Capacitor 70=100 farads
Capacitor 78=400 farads
Capacitor 96=16 farads
Capacitor 30, (as seen in FIG. 2), $C_0=4$ farads
Pump amplitude adjusted so that the variable capacitance is $2\cos(\omega_P t)$.

Utilizing these element values, the admittance as a function of $\omega$ is:

$$Y(\omega)=\frac{4(j\omega+1)[(j\omega)^2+2\times10^{-10}(j\omega)+10^{-2}]}{(j\omega)^2+0.20016(j\omega)+.008} \quad (2)$$

where $\omega$ may be any radian frequency in the circuit.

The bracketed factor in the numerator of Equation 2 provides the necessary resonance near $\omega_i=0.1$. The first factor of the numerator of Equation 2 insures a broad band response at the desired input signal frequencies.

As may be seen in FIG. 5, the impedance $$\frac{1}{|Y|}$$

is very small at all frequencies except at the idler frequency $\omega_i$ which is the only resonance required in accordance with this invention. The circuit is thus broadband at the required frequencies. The circuit of FIG. 4 has been found to provide amplification at not only the difference frequency $\omega_P-\omega_i$ but also at the sum frequency $\omega_P+\omega_i$. For a predetermined $\omega_i$ this amplification at the sum frequency of $(\omega_P+\omega_i)$ results when the idler resonance of the circuit 97 is relatively sharp by proper selection of the elements thereof. Amplification at the sum frequency can be obtained only if the higher frequencies, this includes $(2\omega_P\pm\omega_i)$, $(3\omega_P\pm\omega_i)$, etc., are allowed by the element values. These allowed frequencies are permitted in the circuit of FIG. 4 because of the broad band arrangement shown by FIG. 5. The exact conditions necessary for providing amplification at the sum frequencies are not completely understood at this time.

The operation of the circuit of FIG. 4 has been simulated on a computer to provide negative conductance regions as shown in FIGS. 8 and 9 with the previously given examples of element values. At a pumping frequency $\omega_P$ of 1.0, a curve 140 of FIG. 8 shows a negative conductance region with the input signal $\omega_S$ equal to .8996 radian per second at a peak 142. At the same pumping frequency a curve 148 of FIG. 9 shows a negative conductance peak 149 at an input signal frequency $\omega_S$ of 1.1004 radians per second. Thus, the circuit of FIG. 4 develops a negative conductance at a frequency $(\omega_P-\omega_i)$ and $(\omega_P+\omega_i)$ so that amplification of the signal $E_S$ occurs at both frequencies.

The circuit of FIG. 4 is tunable over a wide frequency range with negative resistance to provide amplification as shown by a curve 150 of FIG. 10 which illustrates the input signal frequency $\omega_S$ when equal to the difference frequency $(\omega_P-\omega_i)$ versus negative resistance $-R$. A curve 152 shows the input signal frequency $\omega_S$ when equal to the sum frequency $(\omega_P+\omega_i)$ as a function of negative resistance $-R$. As discussed above, tuning is performed by varying the pump frequency $\omega_P$ with the signal frequency. It is to be noted that the tuning range is limited for sum frequency amplification as shown by the curve 152.

Thus, there has been described a simplified tunable single-stage, linear parametric amplifier which includes a time variant capacitor and a network of fixed resistors, inductors and capacitors. A single sharply tuned idler circuit is all that is required for the amplification in accordance with the invention. Tuning is performed by varying only the pumping frequency. In one arrangement in accordance with the invention, a sharply tuned idler resonant circuit provides a relatively large amplification at frequencies of both $(\omega_P+\omega_i)$ and $(\omega_P-\omega_i)$ for any tuned value of $\omega_P$.

What is claimed is:

1. A parametric amplifier comprising: first reactance means for providing a fixed reactance component and a reactance component which is variable at a pump frequency, means for applying an input signal of a selected frequency to said first reactance means, second reactance means coupled to said first reactance means to provide series resonance with said fixed reactance component at an idler frequency equal to the magnitude of the difference between said selected frequency and said pump frequency, a parallel resonant circuit coupled across said second reactance means and sharply tuned to said idler frequency, and a series resonant circuit coupled across said input signal applying means and tuned to said idler frequency.

2. A parametric amplifier comprising: first reactance means for providing a fixed reactance component and a reactance component which is variable at a pump frequency, means for applying a signal to be amplified and of a frequency higher than said pump frequency to said first reactance means, second reactance means coupled to said first reactance means to provide series resonance with said fixed reactance component at an idler frequency equal to the difference between said signal frequency and said pump frequency, a parallel resonant circuit coupled across said second reactance means and sharply tuned to said idler frequency, and a series resonant circuit coupled across said signal applying means and tuned to said idler frequency.

3. A parametric amplifier comprising: capacitance means for providing a fixed capacitance component and a capacitance component which is variable at a pump frequency, means for applying an input signal of a selected frequency to said capacitance means, inductance means coupled to said capacitance means to provide series resonance with said fixed capacitance component at an idler frequency equal to the difference between said selected frequency and said pump frequency, a parallel resonant circuit coupled across said inductance means and sharply tuned to said idler frequency, and a series resonant circuit coupled across said input signal applying means and tuned to said idler frequency.

4. A parametric amplifier comprising: capacitance means for providing a fixed capacitance component and a capacitance component which is variable at a pump frequency, means for applying an input signal of a frequency higher than said pump frequency to said capacitance means, inductance means coupled to said capacitance means to provide series resonance with said fixed capacitance component at an idler frequency equal to the difference between said input signal frequency and said pump frequency, a parallel resonant circuit coupled across said inductance means and sharply tuned to said idler frequency, and a series resonant circuit coupled across said input signal applying means and tuned to said idler frequency.

5. A parametric amplifier comprising a variable capacitance diode, means for applying to said diode a direct bias and an alternating signal which varies at a pump frequency to provide in said diode a fixed capacitance component and a capacitance component which varies at said pump frequency, source means for applying an input signal of a selected frequency to said diode, inductance means coupled to said diode to provide series resonance with said fixed capacitance component at an idler frequency equal to the magnitude of the difference between said selected frequency and said pump frequency, a parallel resonant circuit coupled to said diode and sharply tuned to said idler frequency for providing a high impedance for signals at said idler frequency and a low impedance for signals at said selected frequency, a series resonant circuit coupled across said source means and tuned to said idler frequency, and an output circuit coupled to said diode and to said parallel resonant circuit for translating amplified signals at said selected frequency.

6. A parametric amplifier comprising: a variable capacitance diode, means for applying to said diode a direct bias and an alternating signal which varies at a pump frequency to provide in said diode a fixed capacitance component and a capacitance component which varies at said pump frequency, source means for applying an input signal of a frequency higher than said pump frequency to said diode, inductance means coupled to said diode to provide series resonance with said fixed capacitance component at an idler frequency equal to the difference between said input signal frequency and said pump frequency, a parallel resonant circuit coupled to said diode and sharply tuned to said idler frequency for providing a high impedance for signals at said idler frequency and a low impedance for signals at said input signal frequency, a series resonant circuit coupled across said source means and tuned to said idler frequency, and an output circuit coupled to said diode and to said parallel resonant circuit for translating amplified signals at said input signal frequency.

7. A parametric amplifier comprising: a variable capacitance diode having first and second electrodes, bias means having one terminal coupled to said first electrode for applying a direct bias thereto, pump source means having a first terminal coupled to said second electrode and having a second terminal coupled to another terminal of said bias means for applying to said diode an alternating signal which varies at a pump frequency to provide in said diode a fixed capacitance component and a capacitance component which varies at said pump frequency, input source means coupled between said first and second terminals for applying an input signal of a selected frequency to said diode, a first capacitor coupled between said first and second terminals, a first inductor coupled between said first electrode of said diode and said one terminal of said bias means, said first inductor being resonant with said fixed capacitance component at an idler frequency equal to the magnitude of the difference between said selected frequency and said pump frequency, an output coupling impedance device having one terminal coupled to said first electrode of said diode and having another terminal, a second inductor and a second capacitor coupled in parallel between said another terminal of said impedance device and said one terminal of said bias means, said second inductor and said second capacitor being resonant at said idler frequency, and a third inductor and a third capacitor coupled in series between said first and said second terminals, said third inductor and said third capacitor being resonant at said idler frequency.

8. A parametric amplifier comprising: a variable capacitance diode having first and second electrodes, bias means having one terminal coupled to said first electrode for applying a direct bias thereto, pump source means having a first terminal coupled to said second electrode and having a second terminal coupled to another terminal of said bias means for applying to said diode an alternating signal which varies at a pump frequency to provide in said diode a fixed capacitance component and a capacitance component which varies at said pump frequency, input source means coupled between said first and second terminals for applying an input signal of a frequency higher than said pump frequency to said diode, a first capacitor coupled between said first and second terminals, a first inductor coupled between said first electrode of said diode and said one terminal of said bias means, said first inductor being resonant with said fixed capacitance component at an idler frequency equal to the difference between said input signal and said pump frequencies, an output coupling impedance device having one terminal coupled to said first electrode of said diode and having another terminal, a second inductor and a second capacitor coupled in parallel between said another terminal of said impedance device and said one terminal of said bias means, said second inductor and said second capacitor being resonant at said idler frequency, and a third inductor and a third capacitor coupled in series between said first and said second terminals, said third inductor and said third capacitor being resonant at said idler frequency.

References Cited by the Examiner

Fisher: "Proceedings of the IRE," July 1960, pp. 1227–1232.

"Varactor Applications," by Penfield et al., The M.I.T. Press, Cambridge (Mass.), 1962, pp. 160–165, 169–173.

ROY LAKE, *Primary Examiner.*

D. R. HOSTETTER, *Assistant Examiner.*